(12) United States Patent
Feuerbaum et al.

(10) Patent No.: US 6,555,815 B2
(45) Date of Patent: *Apr. 29, 2003

(54) APPARATUS AND METHOD FOR EXAMINING SPECIMEN WITH A CHARGED PARTICLE BEAM

(75) Inventors: Hans-Peter Feuerbaum, Munich (DE); Dieter Winkler, Munich (DE)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/342,802

(22) Filed: Jun. 29, 1999

(65) Prior Publication Data

US 2002/0053638 A1 May 9, 2002

(51) Int. Cl.$^7$ ............................. H01J 37/00; H01J 37/30
(52) U.S. Cl. ................... 250/310; 250/306; 250/396 R; 250/396 ML; 250/397; 250/492.2; 250/492.3; 250/428
(58) Field of Search .................. 250/306, 310, 250/396 R, 397, 492.2, 492.3, 428

(56) References Cited

U.S. PATENT DOCUMENTS

| 5,312,519 | A | | 5/1994 | Sakai et al. ............... 134/1 |
| 5,338,939 | A | | 8/1994 | Nishino et al. ...... 250/396 ML |
| 5,396,067 | A | | 3/1995 | Suzuki et al. ............. 250/310 |
| 5,637,538 | A | | 6/1997 | Frosien et al. ............ 438/685 |
| 5,869,833 | A | | 2/1999 | Richardson et al. ........ 250/310 |
| 5,885,354 | A | * | 3/1999 | Frosien et al. ......... 118/723 FE |
| 5,976,328 | A | * | 11/1999 | Azuma et al. ......... 204/192.34 |
| 6,005,660 | A | * | 12/1999 | Yoshida et al. .......... 356/237.3 |
| 6,093,246 | A | | 7/2000 | Lin et al. .................. 117/928 |
| 6,105,589 | A | | 8/2000 | Vane ......................... 134/1.1 |

FOREIGN PATENT DOCUMENTS

| DE | 3332248 | 9/1983 |
| JP | 03-194838 | 8/1991 |
| WO | 98/00782 | 1/1998 |

OTHER PUBLICATIONS

European Search Report.

* cited by examiner

Primary Examiner—Bruce Anderson
Assistant Examiner—Nikita Wells
(74) Attorney, Agent, or Firm—Sughrue, Mion, Zinn, MacPeak & Seas, LLP.

(57) ABSTRACT

An apparatus for examining a specimen with a beam of charged particles, where charging of the specimen is avoided or reduced by injecting inert gas onto the sample's surface. In order to avoid interactions with the electron optics, various embodiments are disclosed for providing a rotationally symmetrical nozzles and/or electrodes. Additionally, embodiments are disclosed wherein a plurality of gas conduits are arranged in a rotationally symmetrical manner. Alternatively, the conduit is incorporated into an element of the electron optics, such as the magnetic lens. Also, in order to reduce or eliminate interaction of the electrons with the gas molecules, embodiments are disclosed wherein the gas is pulsated, rather than continually injected.

63 Claims, 6 Drawing Sheets

APPARATUS AND METHOD FOR EXAMINING SPECIMEN WITH A CHARGED PARTICLE BEAM

FIELD OF THE INVENTION

This invention relates to a charged particle beam device for the examination of specimens. In particular, this invention relates to the examination of specimens which have the tendency of getting charged while being radiated with a charged particle beam.

BACKGROUND OF THE INVENTION

Negatively or positively charged particles coming from a particle source can be accelerated by a potential of V volts. The direction of travel of such a moving particle is altered by applying either a magnetic or an electric field; for example, a charged particle moving in a magnetic field experiences a force tending to change its direction of motion except when it is travelling parallel to the magnetic lines of force. Suitably shaped magnetic and electric fields can be used to cause charged particles diverging from a source to converge into a beam, guide the beam along a predetermined path and allow it to impinge on the surface of a substrate or a specimen.

The charged particles interact with the atoms of the specimen and cause a number of different effects in the specimen or on its surface. Without limiting the scope of the present invention, the following explanations will primarily concentrate on the use of electrons as charged particles. The impinging electrons, generally called primary electrons (PE), are deflected by collisions with specimen atoms. These collisions may be elastic when the electron is deflected (even up to 180 degrees), but no energy interchange occurs. They may also be inelastic when the primary electron interacts with the atom and supplies energy for a further process to occur. Such a process could result in the emission of an electron, called secondary electron (SE) and/or electromagnetic radiation. Thereby, the primary electron generally experiences only a small deviation of track. After the collision or collisions, the primary electron may re-emerge as backscattered electron (BSE) or as transmitted electron, or may lose all its energy and come to rest in the specimen. There, the primary electron contributes to the specimen's heating or to the specimen's absorbed charge.

The above indicated physical effects can provide much analytical information about the specimen. In the following, the creation of secondary electrons and their informational content of the specimen will be considered in greater detail. An inelastic collision of an incident primary electron having a kinetic energy of e.g. 1 keV, can result in electrons being detached from the specimen atoms. This leaves behind an ionized atom with a positive charge. The dislocated electrons have a low kinetic energy, typically less than 50 eV, and are easily captured by nearby atoms. Some electrons which are created closer to the surface can be emitted from the specimen and can be collected with specific detectors. Consequently, only a small portion of the secondary electrons formed are available for collection. Since the emitted SE originate from a small region very close to the surface of the specimen, they carry corresponding surface information.

In particular, a surface of the specimen which is tilted relative to the incident beam reacts differently than a surface perpendicular to the incident beam. Compared to a flat surface, the electrons having entered a tilted surface of the specimen propagate a longer distance close to the specimen's surface. This results in a greater proportion of secondary electrons that are to escape, and so the electron emission from the surface will increase. The intensity of the secondary electron emission is therefore an indicator of the surface slope and topography. Therefore, the intensity signals collected by secondary electron detectors can be used for high-resolution surface imaging. Instruments visualizing these surface effects have become increasingly important for the development of e.g. microelectronic components. They are used to identify deviations from predetermined patterns or to evaluate topographical parameters such as height, width or angle of inclination of the structure under examination. An example of a widely used system is the scanning electron microscope (SEM). A critical dimension SEM (CD-SEM) is routinely used to measure dimensions of elements on a semiconductor wafer to a nanometer resolution.

It should be appreciated that in order to obtain an image using the SEM, the number of electrons in the primary beam must be different from the number of electrons emitted from the specimen (i.e., the yield must be different from 1). This is especially true for insulators and semiconductors where charge is easily accumulated. The charge can result in a strong electrical field prevailing at the surface of the specimen and substantially altering the image of its surface by, for example, altering the path of PE's and SE's. In a semiconductor device, for example, electric insulators such as SiO2 are often deposited on conductors such as Al or semiconductors such as silicon. When a PE beam is directed onto the device, the surface of the insulator is charged. The resulting electric field alters the direction of PE's and SE's and results in inaccurate measurement of the features. This problem is even more severe when several lines to be measured are closely positioned, so that many interactions with charge fields occur to cause deviation from the actual measurement. Additionally, such a field at the surface can prevent SE created at the bottom of a contact hole and vias from reaching the detector.

In the past, a variety of methods have been tried to solve these problems. The approaches included adaptation of the acceleration voltage and the current of the electron beam. Others have altered the scanning speed of the primary electron beam or modulated the primary electron beam before impinging on the specimen. However, these methods have not been satisfactory. In some cases the intensity of the emitted secondary electrons is too low, in other cases the results obtained by comparative measurements are unreliable.

In an alternative approach, Environmental Scanning Electron Microscopes (ESEM) have been used. Originally these instruments were developed for the examination of specimens which are sensitive to dehydration caused by the vacuum in the specimen chamber. The use of a low pressure environment in the chamber prevented the dehydration. As a secondary effect, the presence of ions in the irradiated gas impeded charging of the specimen. These ESEM systems, however, cause widening of the beam of charged particles due to the scattering of the primary electrons due to the absence of vacuum. Also, the high gas concentration in the electrical fields between the detectors and the specimen can result in arcing. Therefore, the conventional ESEM systems did not lead to satisfactory results either and cannot be used for semiconductor applications since such applications require high vacuum environment.

Various proposed methods to avoid charging in SEM examination of semiconductors are presented in U.S. Pat. No. 5,869,833. While the focus of that patent is various scanning schematics to prevent charge or cause discharge, there is also a mention of introducing gas into the vacuum chamber. However, the discussion relating to the introduction of gas is basically limited to a single paragraph and lacks many details needed to suggest a working system.

SUMMARY OF THE INVENTION

Accordingly, the present inventors undertook an in-depth study of the subject of semiconductor charging and, in particular, the use of gas discharge in a vacuum chamber. Thus, the present inventors uncovered many of the difficulties needed to be overcome in order to make such a system workable in practice. The various problems and solutions worked out by the present inventors are detailed herein.

The present invention intends to provide an improved apparatus and method for examining a specimen with a charged particle beam. Specifically, the various embodiments of the present invention utilize injection of gas into the vacuum chamber to assist in discharge of the specimen.

According to a further aspect of the present invention, there is provided an apparatus for examining a specimen with a beam of charged particles. The apparatus comprises a particle source for providing a beam of charged particles which propagate along an optical axis and an optical device for directing said beam of charged particles onto said specimen to be examined. Further, the apparatus comprises a gas supply for providing an inert gas to the area of incidence of said beam of charged particles onto said specimen, and a vacuum chamber for loading said specimen. According to one aspect of the present invention, the inert gas is provided in the form of a layer. This layer preferably covers the area of the specimen where the beam of charged particles is incident. In the context of this application "layer" is not understood as a geometrical object with clearly defined limits. Rather, the inert gas molecules forming the layer preferably have a higher concentration in the area of the specimen where the beam is incident. The concentration decreases along the beam with increasing distance to the specimen.

In a further preferred aspect of the present invention, a nozzle directs the stream of inert gas to the area of incidence. This could preferably be done by either varying the gas flow or by varying the pressure, or by varying both. Instead of a single nozzle two or more can be used to provide the inert gas. In such a case the nozzles are preferably arranged in a symmetrical pattern.

According to a still further aspect of the present invention, there is provided an electrode in the vicinity of the area of incidence of the charged particle beam. The electrode allows a controlled charging of the specimen. The inert gas will cause an exchange of charge between the specimen and the electrode. Advantageously, the electrode establishes a desired voltage level in a limited region of the specimen. Furthermore, it is preferred to provide means for positioning the electrode e.g. with an x-y-z manipulator (e.g., FIG. 1). Depending on the material or the surface structure of the specimen, the electrode can be placed at a specific location over the specimen with a specific distance from it.

In another embodiment according to the invention, the nozzle and the electrode are provided as an integral part. This can be achieved either by a common carrier or by attaching the electrode to the nozzle. Preferably the electrode is arranged in front of the nozzle. Both parts, the nozzle and the electrode, advantageously comprise a coupling device. This allows exchange with other nozzles or electrodes having different geometrical dimensions and therefore, different physical properties.

It is preferred to use an electrode creating an electrostatic field with a rotational symmetry. This symmetry limits the influence on the trajectory of the incident charged particle beam and the secondary electrons. In one such embodiment, the electrode is a circular ring electrode with the charged particle beam being guided through its center.

Advantageously, the electrode comprises a conductive net. At least one of the net meshes is used to let the particle beam pass. Although such an arrangement will slightly distort the rotational symmetry of the resulting electrostatic field, it improves the efficiency of the electrode in controlling the charging.

According to another aspect there are provided vacuum means capable of providing a pressure gradient in the specimen chamber. Preferably the pressure gradient is established along the incident particle beam with a higher pressure at the point of incidence and a lower pressure at the aperture for permitting the particle beam to enter the specimen chamber. The pressure gradient reduces the number of collisions between the particle beam and any atoms or molecules other than those in the specimen. Preferably the pressure gradient is established in such a way that the particles of the incident beam collide on the average less than once with an atom or molecule in the chamber before hitting the specimen.

Preferred inert gases used in the context of this application are $N_2$, $CO_2$, or $SF_6$ or noble gases such as Argon. The gases used, however, are not limited to those mentioned above. Any other gas which is inert to reacting with the surface of the specimen can be used.

According to another aspect of the invention, inert gas is provided to the area of incidence in a discontinuous or pulsating manner. This allows reduction of the amount of inert gas in the specimen chamber. Inert gas is primarily guided to the area of incidence when it is needed for decharging.

According to a further aspect of the invention, the gas conduit is integrated into the objective lens or into any other mechanical parts close to the specimen. Such an arrangement allows for the use of existing set up of a microscope column and maintains the rotational symmetry around the optical axis.

According to a still further aspect of the present invention, there is provided a charged particle beam apparatus comprising a particle source and an optical device for directing a beam of charged particles onto said specimen to be examined. The apparatus further comprises a gas supply for providing a gas to the area of incidence of said beam of charged particles and a 2-way valve arranged in the gas supply whereby a first port of the 2-way valve is connected with a gas reservoir and a second port of the gas supply is connected with a vacuum reservoir. A control unit switches the 2-way valve.

The invention is also directed to methods by which the described apparatus operates. It includes method steps for carrying out every function of the apparatus. Furthermore, the invention is also directed to apparatus for carrying out the disclosed methods and including apparatus parts for performing each described method step. These method steps may be performed by way of hardware components, a computer programmed by appropriate software, by any combination of the two or in any other manner.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Figure 1:
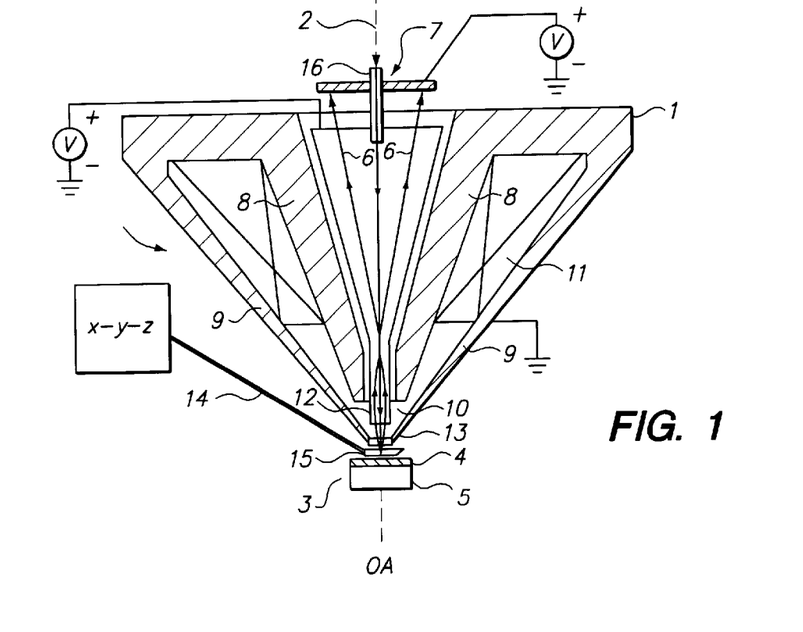
FIG. 1 is a schematic vertical cross section of an objective lens for a charged particle beam device comprising a gas conduit with a symmetrical electrode, according to one embodiment of the invention.

An exemplary embodiment of an objective lens unit 1 used in an apparatus for examining a specimen is shown in FIG. 1. This lens is preferably used as a component in the optical column of a scanning electron microscope. A primary electron beam 2 generated by an electron source (shown in FIG. 3) propagates along an optical axis OA and is focused onto a specimen 3. It is not required that the primary electron beam always propagates along the optical axis. On its way from the source to the specimen the particle beam can be deflected from the optical axis OA or its vicinity and, at a later stage, reflected back to the optical axis. In the shown embodiment the specimen 3 is a microelectronic component with an insulator layer 4 on substrate layer 5. For examining the specimen, a particular region of the specimen is scanned with the primary electron beam. The scanning or deflection of the beam is done by the scanning coil system which is driven by a scanning generator (both not shown in FIG. 1). The interactions of the beam with the specimen result e.g. in secondary electrons. In the area of incidence, due to the insulating surface 4 of the specimen, the primary electron beam will cause localized charging. The secondary electrons can be measured with an appropriate detector 7. In the illustrated example the detector is arranged immediately above the lens body symmetrically relative to the optical axis OA. The detector 7 is preferably an annular electron sensitive part that includes a hollow cylinder 16 fitted into a central bore therein. The hollow cylinder 16, which can be charged with a somewhat lower positive potential compared to the upper electrode 12 of the electrostatic lens, extends into the upper body of the lens body.

The shown conical magnetic lens having an upper pole piece 8 and a lower pole piece 9 is fed by an excitation coil 11. The magnetic flux of the magnetic lens is concentrated in the area of the pole piece gap 10 between the upper and lower pole pieces 8, 9. Here, the magnetic field reaches its maximum strength and is nearly rotationally symmetrical about the optical axis OA. The imaging properties of the objective lens unit 1 are also determined by the electrostatic lens. In the embodiment shown, an upper electrode 12 and a lower electrode 13 establish a nearly rotationally symmetrical electric lens field with its principal plane located in between the principal plane of the conical magnetic lens and the specimen 3. In the illustrated exemplary embodiment the upper electrode 12 is preferably in the form of a truncated cone tapering in the direction of the specimen; its end part is a cylindrical tube projecting into the region of the pole piece gap 10. The positive potential of this electrode is, for example, 5 to 10 kV. The lower electrode 13 which has a conical shape is, for example, grounded. The resulting electric field is a retarding field decelerating the high speed electrons coming through the upper electrode 12.

As shown in FIG. 1, a gas conduit 14 is used to supply discharging gas at the vicinity of the sample. However, as noted by the present inventors, presenting the conduit into the vicinity of the primary beam may cause distortions in the electron optics. Thus, the inventors devised a solution as follows.

Between the specimen 3 and the lower electrode 13 a reference electrode 15 is arranged. In the shown embodiment the electrode has a rotationally symmetrical shape. The reference electrode is arranged at the end of gas conduit 14 which supplies the inert gas to a nozzle integrated into the reference electrode. On one hand, the reference electrode 15 can be used to establish a predetermined voltage in the part of the specimen surface which is located in the direct vicinity of the reference electrode. On the other hand, depending on the voltage applied to it, the reference electrode also assists in sucking secondary electrons from the wafer's surface to enhance the imaging. Deviations of the electrostatic field caused by the presence of the nozzle are minimized by arranging a symmetrical electrode at the nozzle's tip portion. In one embodiment, the nozzle aperture is shaped as an annular opening along the circumference of the reference electrode. Alternatively, such an annular opening of the nozzle aperture can also be used without combining it with a reference electrode. In this case, the circular shaped nozzle attachment 15 acts solely as a circular gas outlet, wherein its circular symmetry minimizes imaging degradation.

Figure 2:
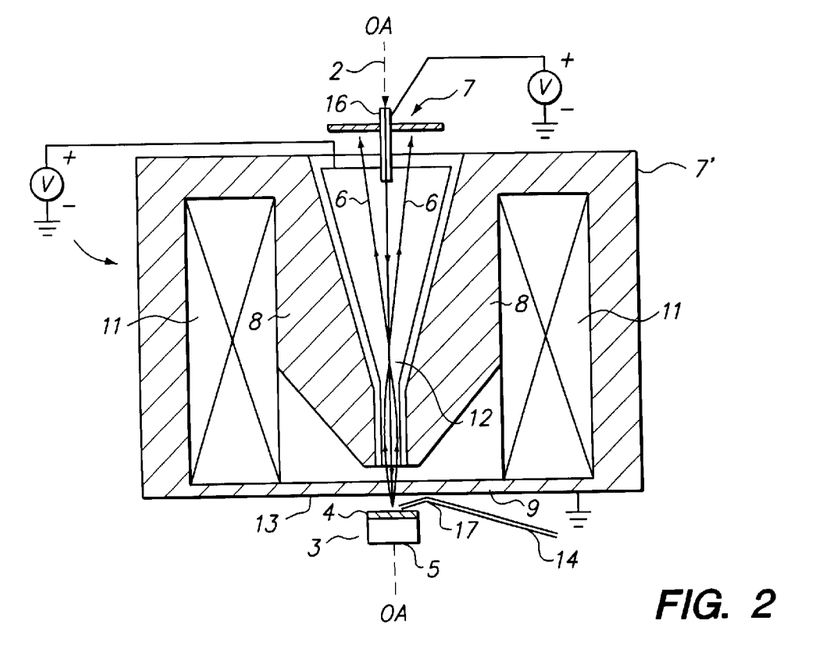
FIG. 2 is a schematic vertical cross section of a second objective lens for a charged particle beam comprising a tube shaped gas conduit, according to another embodiment of the invention.

FIG. 2 shows another objective lens 1' for focusing a beam of primary electrons 2 on the specimen. The lens is essentially composed of a magnetic lens and an electrostatic lens generating fields which are essentially rotationally symmetrical around the optical axis OA of the objective lens. The detector 7 is arranged immediately above the lens body and documents secondary electrons 6 triggered at the specimen by the primary beam of electrons. The magnetic flux generated by an excitation coil 11 is concentrated into a small spatial region around the optical axis OA with the assistance of an upper and a lower pole piece 8, 9. The maximum field strength of the magnetic lens is reached in the pole piece gap 10. The upper electrode 12 of the electrostatic lens includes a cylindrical portion which is arranged in an insulating fashion within a bore in the upper pole piece 8 of the magnetic lens.

The lower pole piece 9 of the magnetic lens preferably lies at ground potential and can be lined with a beam guidance tube of magnetic or non magnetic material (not shown in FIG. 2) for protection against contamination. The lower pole piece, thus, forms the lower electrode 13 of the electrostatic lens which establishes a retarding field. A gas conduit 14 is arranged just below the objective lens. The gas conduit is part of a gas supply which further comprises a gas reservoir (not shown in this figure). In the example shown, the gas conduit is provided in form of a tube whose opening for ejecting the gas is directed towards the area of incidence of the primary electron beam. A preferred distance between the lower edge of the outlet opening and the specimen surface is up to 1 mm. In certain applications the distance is about 100 micrometers. In this case, due to the angle of inclination which the tube opening forms with the surface of the specimen, the working distance of the tube opening from the area of the specimen where the beam is incident is about 0.5 mm. Preferably the diameter of the outlet opening is about 100 micrometers. The gas conduit shows a knee portion 17 and the part of the gas conduit which connects the knee portion 17 with the gas reservoir is directed away from the objective lens. The inclination assist in directing the gas towards the specimen, while maintaining the end of the conduit sufficiently away from the vicinity of the primary beam to avoid interaction. If additional protection against interaction with the primary beam is needed, a nozzle with rotational symmetry can be affixed to the end of the conduit 14.

Figure 3:
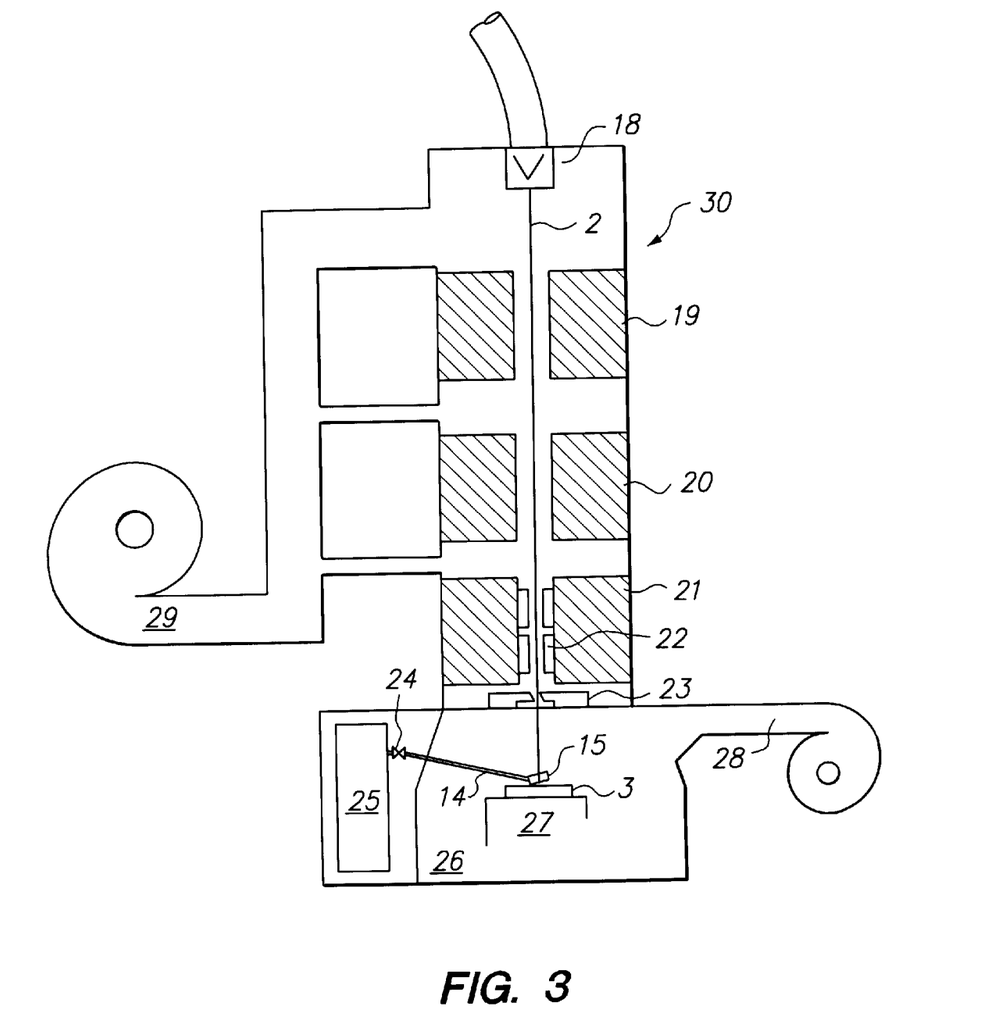
FIG. 3 shows a simplified cross section of the optical column of a scanning electron microscope with a gas supply attached to the specimen chamber, according to an embodiment of the invention.

An exemplary cross section of a scanning electron microscope is shown schematically in FIG. 3. Electron column 30 can be any conventional column, and includes an electron source 18, coils, e.g., 19 and 20, and an objective lens 21, all operating to produce a focused primary electron beam. The focused primary electron beam hits the specimen 3 positioned on a specimen holder 27, located in a vacuum chamber 26. Vacuum pump 28 provides a desired vacuum level so that the primary electrons are not deflected from their predicted path by collisions with any atoms or molecules other than those of the specimen. Furthermore, vacuum pump 29 is provided for evacuating the electron column 30. The aperture 23 separates the optical column from the specimen chamber 26. An inert gas in a gas reservoir 25 is guided through a valve 24 to the gas conduit 14 which directs the stream of inert gas onto the specimen 3. In preferred embodiments a nozzle is provided at the end of the gas conduit 14. The valve 24 can be used for adjusting the pressure used for providing the inert gas.

Within the vacuum chamber 26 into which the specimen to be examined is loaded, an exemplary average base pressure of about $5 \times 10^{-4}$ Pa is prevailing. This average base pressure in the chamber increases to about $5 \times 10^{-3}$ Pa if inert gas is directed to the specimen. The pressure at the outlet of the gas conduit is about 10 Pa. The stream of inert gas creates a mini-environment at the point of incidence of the primary electron beam. While significantly reducing the adverse effects of charging close to the surface of the specimen, this mini environment does not substantially affect the average vacuum level in the chamber to an extent where it hinders the transmission of the beam through the optic column. Scattering of the primary electrons with gas molecules in the chamber is thereby kept at an acceptable level. The vacuum gradient is maintained by balancing the gas flow of the inert gas into the specimen chamber with the amount of gas evacuated from that chamber. The exhaust port of the vacuum pump is preferably arranged in alignment with the stream of inert gas.

Figure 4A:
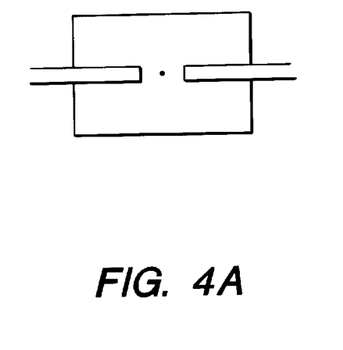
FIGS. 4a–4c depict a top view of a plurality of gas nozzles arranged symmetrically around the area of incidence of the primary electron beam, according to various embodiments of the invention.
Figure 4B:
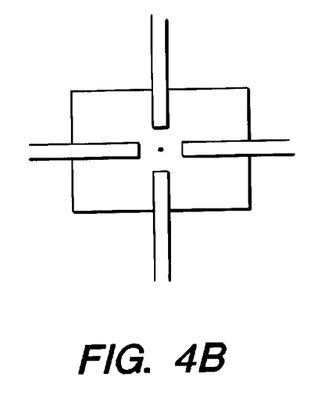
Figure 4C:
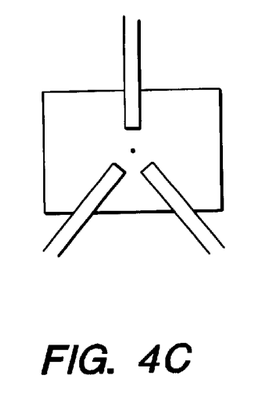
Figure 5A:
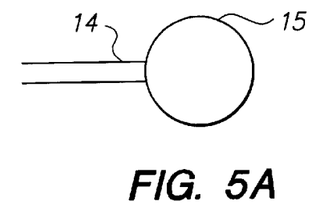
FIGS. 5a–5d depict a top view of gas nozzles with a reference electrode according to various embodiments of the invention.
Figure 5B:
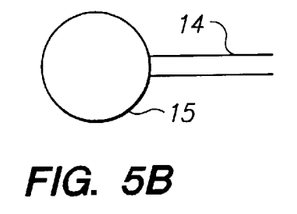
Figure 5C:
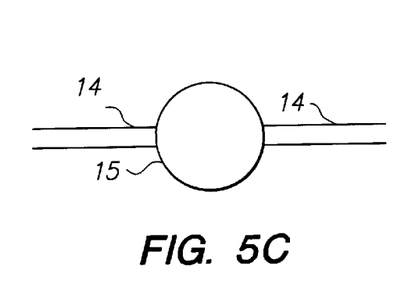
Figure 5D:
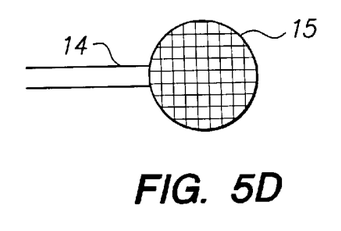

FIGS. 4a–4c show several symmetrical arrangements of gas conduits 14, which may obviate the need for a rotationally symmetrical nozzle. The location of the incident primary electron beam is the center of symmetry. FIGS. 5a–5d show several exemplary combinations of nozzles 15 and gas conduits 14. In each of these embodiments, the nozzle can also function as an electrode. In FIG. 5a the nozzle/electrode is arranged at the tip of the gas outlet or nozzle. In FIG. 5b the gas outlet of the conduit projects into the nozzle/electrode. In FIG. 5c two gas outlets are connected to the nozzle/electrode and in FIG. 5d a conductive net is used to span the rotationally symmetrical electrode. The core mesh of this net is located in the center of the electrode. Alternatively, a rotationally symmetrical conductive net can be used instead of the net shown in FIG. 5d.

The inert gas stream directed to the area of incidence of the charged particle beam onto the specimen significantly reduces the adverse effects of charging without substantially affecting the average vacuum level in the chamber. However, depending on the amount of gas present in the specimen chamber, it may hinder the transmission of the beam before it hits the specimen. Accordingly, according to one advantageous embodiment of the present invention, this negative effect is reduced by providing a pulsed gas stream which supplies inert gas only in the amount necessary for reducing charging and cuts out excessive inert gas.

Figure 6:
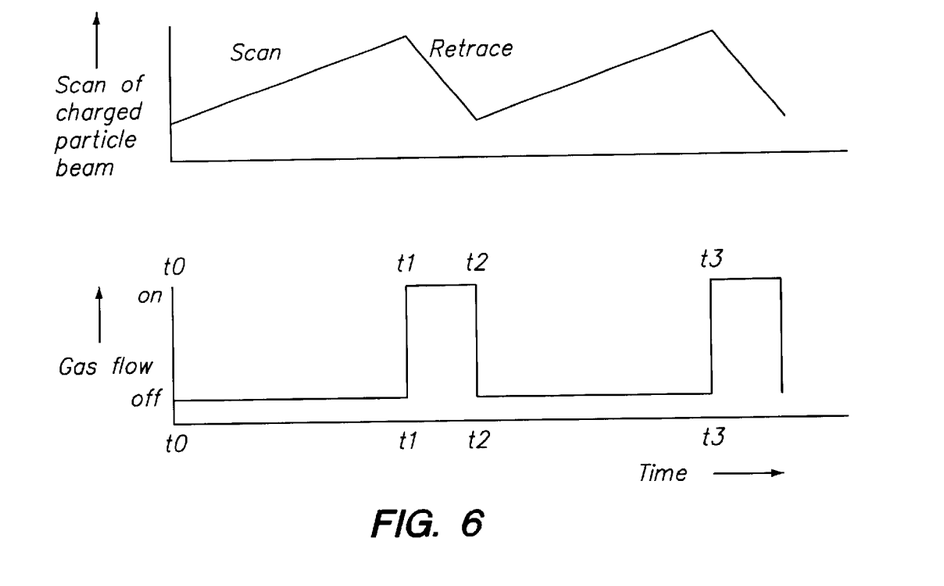
FIG. 6 shows a possible time correlation between the scan movement of the charged particle beam and the gas flow.

An example of such a pulse mode is shown in FIG. 6. The upper diagram shows the scanning movement of the charged particle beam. Similar to the scanning of an electron beam on a television screen, the charged particle beam is guided in a first movement across a first line in the area of the specimen to be examined. The scan movement takes place in the time interval t0 to t1. An image of this line is created by the detection of secondary particles created by the impinging primary particles. At the end of this line, the charged particle beam is retraced to just below the beginning of the line. The retrace movement takes place in the time interval t1 to t2 and during this time interval no image of the specimen is created. Subsequently, the charged particle beam is guided within the time interval t2 to t3 in a second scan movement across the area of the specimen to be examined creating a second line of the respective image. The lower diagram shows the time correlation between the flow of inert gas and the scanning movement of the charged particle beam. In this specific example, the stream of inert gas is directed to the area of incidence during the retrace movement of the charged particle beam i.e. within the time interval t1 to t2. No inert gas is directed to the specimen during the scan movement. This avoids collisions between the primary particles and gas particles. The inert gas particles which are directed to the specimen during the retrace movement remain for some time close to the surface of the specimen thereby reducing the adverse effects of charging.

In certain applications, it will not be necessary to provide the inert gas during the complete retrace movement. It can be advantageous to stop the gas stream prior to t2 if inert gas has been provided in a sufficient amount so that it is still capable to reduce charging for the next scanning movement.

Alternatively, it can be advantageous to still provide inert gas during the first part of the scanning movement so that there are still enough gas particles present and close to the area of incidence to prevent charging at the end of the scanning interval.

Depending on the length of the gas conduit, the pressures used for providing the inert gas, and the distances between the end opening of the gas conduit and the area of incidence, the inert gas particles require some time before they reach the area of incidence. This time delay is considered in an alternative embodiment of the invention, where the on-phase of the pulsed gas stream is initiated prior to t1, and the gas stream is switched off prior to t2. The two time shifts prior to t1 and t2 do not necessarily have to have the same length of time.

Figure 7:
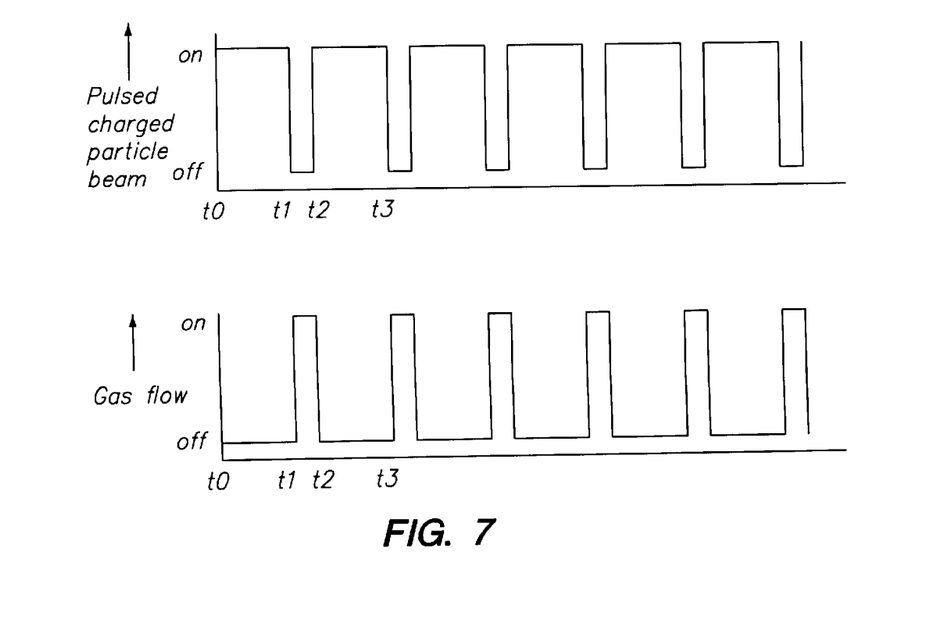
FIG. 7 shows a possible time correlation between a pulsed charged particle beam and the gas flow.

A different correlation between the control of the charged particle beam and the pulsed gas stream is shown in FIG. 7. The upper part of the diagram shows a pulsed charged particle beam during the scanning movement. At t1 the charged particle beam is switched off or blanked and at t2 it is switched on again. At t2 the scanning movement of the charged particle beam is continued at the same spot of the specimen where the scanning movement was interrupted at t1. The lower part of the diagram shows that the scanning pause is used to direct a stream of inert gas onto the area of incidence. Since there are no charged particles impinging on the specimen during the time interval t1 to t2, the number of collisions between primary and secondary particles on one side and gas particles on the other side is considerably reduced. As explained with respect to FIG. 6, the time interval during which inert gas is provided to the area of incidence can be time shifted with respect to the pulse pauses of the charged particle beam. Also, the time intervals during which inert gas is provided can be longer or shorter than the pulse pauses of the charged particle beam.

It is important to note that all of the above described pulse modes are only examples of a vast variety of pulse modes which are capable of reducing charging by providing inert gas to the area of incidence and, simultaneously, trying to keep the disturbing effects of the gas particles which collide with primary and secondary particles to a minimum. All of these pulse variations are within the scope of the present invention.

As noted above, introducing a gas conduit in the vicinity of electrical and magnetic fields influence the trajectory of the primary beam. To avoid disturbing effects, certain embodiments described herein use a nozzle or an electrode having rotational symmetry. In the following, embodiments will be described which incorporate the injection of the gas into lens arrangements.

Figure 8:
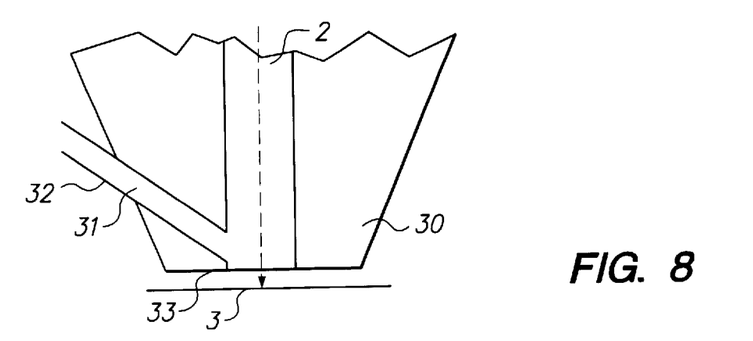
FIG. 8 shows an objective lens with an integrated gas conduit whereby the gas conduit is integrated into a pole piece of the magnetic lens.

In the embodiment shown in FIG. 8, the gas conduit 32 is integrated into the objective lens. A passage 31 in the pole piece 30 of the magnetic lens can either serve directly as a gas conduit or acts as an enclosure for a nozzle or tube implemented into the passage 31. The opening of the passage, as shown in FIG. 8, ends at the inner cylinder of the pole piece 30. Alternatively, the open end of the passage can be arranged in the lower end of the pole piece facing the specimen.

Figure 9:
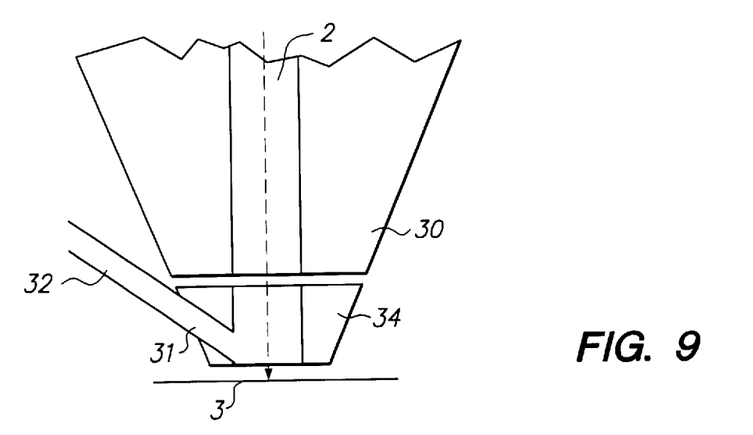
FIG. 9 shows an objective lens with an integrated gas conduit whereby the gas conduit is integrated into an electrode of the electrostatic lens.
Figure 9A:
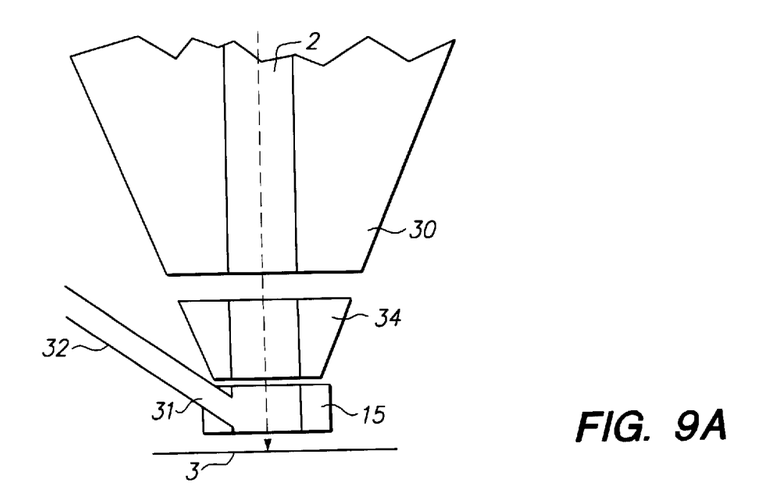
FIG. 9a shows an objective lens with a reference electrode whereby the gas conduit is integrated into the reference electrode arranged below the objective lens.

FIG. 9 shows the electrode of an electrostatic lens 34 arranged between the pole piece 30 of a magnetic lens and the specimen 3. Here, the gas conduit 31 is integrated into the electrode of the electrostatic lens. A passage 31 serves directly as gas conduit or acts as enclosure for a nozzle or a tube. FIG. 9a shows a similar arrangement to that of FIG. 9, whereby an additional reference electrode 15 is placed between the electrode of the electrostatic lens 34 and the specimen 3. This reference electrode could also be placed between the specimen and the pole piece of the embodiment shown in FIG. 8. By integrating the gas conduit into mechanical parts arranged in the direct vicinity of or closest to the specimen, the set up of the microscope column does not have to be changed and the electric and magnetic fields for directing the primary and secondary particles are hardly altered. The integration of a gas conduit into mechanical parts in the vicinity of and/or closest to the area of impact of the charged particle beam is preferably used in combination with the above described charging phenomenon, however, it can also be used in all kinds of charged particle beam apparatuses where a gas interacts with a charged particle beam.

The gas flow which is directed to the specimen can be controlled with a continuously adaptable valve for the flow control. Alternatively, it is possible to use a pulsed gas stream with a pulse frequency sufficiently high so that the pulsating gas flow provides a consistent gas layer or environment close to the area of incidence. A fine tuning of the gas environment can be achieved by choosing a proper on/off ratio for the pulse mode.

Figure 10:
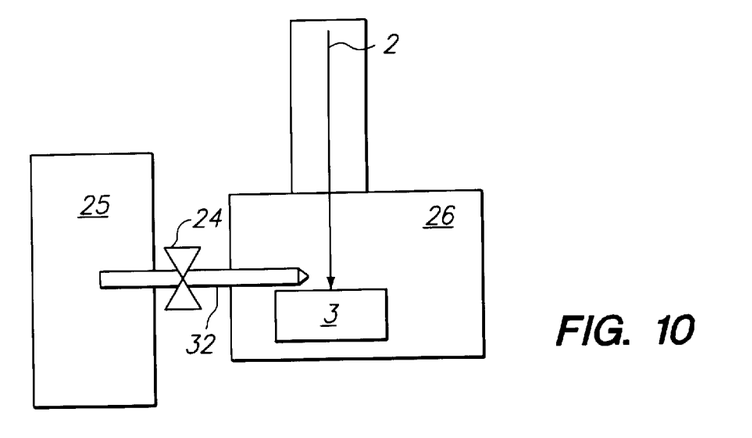
FIG. 10 shows a gas conduit directed to the specimen with a valve arranged between the gas reservoir and the specimen chamber.
Figure 11:
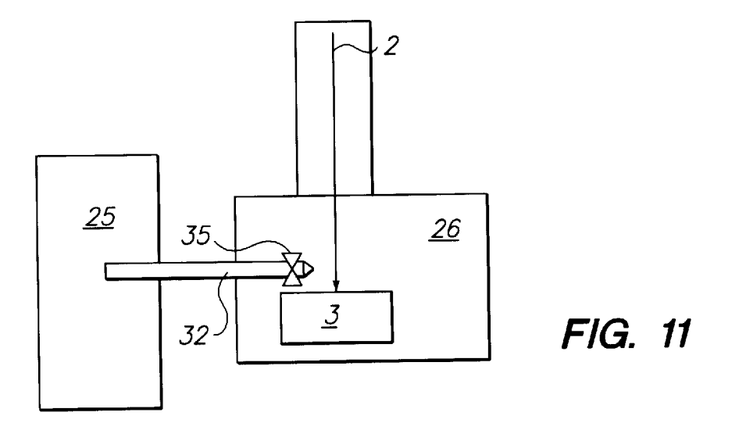
FIG. 11 shows a gas conduit directed to the specimen with a micro valve arranged at the end of the gas conduit.
Figure 12:
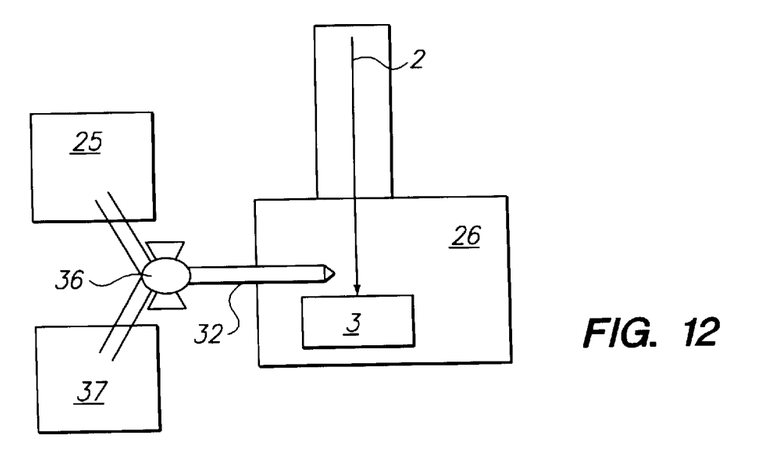
FIG. 12 shows a gas conduit directed to the specimen with a 2 way valve arranged in the gas conduit.

FIG. 10 shows an embodiment in which the valve 24 for manipulating the stream of gas is situated in between the specimen chamber 26 and the gas reservoir 25. By opening and closing the valve a pulsed gas stream is created and directed through the gas conduit 32 to the specimen 3. FIG. 11 shows an alternative embodiment in which a micro valve 35 is integrated close to the end of the gas conduit. This has the advantage that after the closing of the micro valve 35, the time required to evacuate the remaining gas in the gas conduit is considerably reduced. In a further embodiment shown in FIG. 12, a 2 way valve 36 is used. One port of the 2 way valve 36 is connected to the gas reservoir 25 and the other port of the 2 way valve is connected to a vacuum reservoir. Preferably, the volume of the vacuum or evacuated reservoir is much bigger than the volume of the gas conduit 32. In order to shut off the gas flow, the connection between the gas conduit 32 and the gas reservoir 25 is interrupted and the connection between the gas conduit 32 and the evacuated reservoir 36 is opened. This results in an immediate drop in pressure in the gas conduit. This arrangement can be more advantageous than use of a micro valve. The 2 way valve can not only be used to reduce charging by providing inert gas, but it can be applied in all charged particle apparatuses in which a gas flow of any kind is directed to the area of incidence of a charged particle beam. This allows the gas or gases to interact with the corpuscular beam in defined time intervals. Instead of a 2-way valve a multiple way valve could be used and more than one port connected with different gas reservoirs and/or more than one port could be connected with different vacuum reservoir. Advantageously a gas conduit integrated into mechanical parts of the charged particle beam apparatuses e.g. as shown in FIGS. 8, 9 and 9a is used.

Those skilled in the art will readily appreciate that various modifications and changes may be applied to the preferred embodiments of the invention as hereinbefore described without departing from its scope defined in and by the appended claims.

What is claimed is:

1. An apparatus for examining a specimen with a beam of charged particles, said apparatus comprising:

a particle column providing a beam of charged particles;

an objective lens situated inside the column and focusing said beam of charged particles onto said specimen;

a vacuum chamber enclosing the specimen;

a gas conduit providing inert gas to an area of incidence of said beam of charged particles onto said specimen; and an aperture separating the particle column from the vacuum chamber enclosing the specimen.

2. The apparatus according to claim 1, wherein the inert gas forms a layer covering the area of incidence of said beam of charged particles.

3. The apparatus according to claim 2, wherein the layer of inert gas in the area of incidence of said beam of charged particles has a thickness of less than about the mean free path of the charged particles.

4. The apparatus according to claim 1, further comprising a nozzle, situated at an outlet of the gas conduit, said nozzle comprising an electrode.

5. The apparatus according to claim 4 further comprising an actuator adjusting the position of said nozzle.

6. The apparatus according to claim 1, further comprising at least one additional conduit arranged with said gas conduit in a symmetrical pattern around the area of incidence of said beam of charged particles onto the specimen.

7. The apparatus according to claim 1, further comprising
a gas flow valve;
a controller actuating said valve to pulsate delivery of said gas.

8. The apparatus according to claim 4, further comprising a voltage controller applying potential to said electrode.

9. The apparatus according to claim 4, wherein said electrode comprises a circular ring electrode.

10. The apparatus according to claim 4, wherein said electrode comprises a conductive net with at least one opening for said beam of charged particles.

11. The apparatus according to claim 1, further comprising:
a gas reservoir;
an evacuation chamber;
a gas flow valve connected to said reservoir, said evacuation chamber and said gas conduit; and
a controller controlling said valve to alternately couple said conduit to said gas reservoir and evacuation chamber.

12. An apparatus for examining a specimen with a beam of charged particles, said apparatus comprising:
a particle column providing a beam of charged particles;
an objective lens situated inside the column;
a vacuum chamber enclosing the specimen;
a gas conduit providing inert gas to an area of incidence of said beam of charged particles onto said specimen; and
an electrode in combination with said gas conduit, said electrode being located between the objective lens and the specimen.

13. The apparatus according to claim 12, wherein the inert gas forms a layer covering the area of the incidence of said beam of charged particles.

14. The apparatus according to claim 13, wherein the layer of inert gas in the area of incidence of said beam of charged particles has a thickness of less than about the mean free path of the charged particles.

15. The apparatus according to claim 12, further comprising a nozzle, situated at an outlet of the gas conduit, and an actuator adjusting the position of said nozzle.

16. The apparatus according to claim 12, further comprising at least one additional conduit arranged with said gas conduit in a symmetrical pattern around the area of incidence of said beam of charged particles onto the specimen.

17. The apparatus according to claim 12, further comprising
a gas flow valve; and
a controller actuating said valve to pulsate delivery of said gas.

18. The apparatus according to claim 12, further comprising a voltage controller applying a potential to said electrode.

19. The apparatus according to claim 12, wherein said electrode comprises a circular ring electrode.

20. The apparatus according to claim 12, wherein said electrode comprises a conductive net with at least one opening for said beam of charged particles.

21. The apparatus according to claim 12, further comprising:
a gas reservoir;
an evacuation chamber;
a gas flow valve connected to said reservoir, said evacuation chamber and said gas conduit; and
a controller controlling said valve to alternately couple said conduit to said gas reservoir and evacuation chamber.

22. An apparatus for examining a specimen with a beam of charged particles, said apparatus comprising:
a particle column providing a beam of charged particles;
an objective lens situated inside the column;
a vacuum chamber enclosing the specimen;
a gas conduit providing inert gas to an area of incidence of said beam of charged particles onto said specimen;
whereby a distance between the lower edge of an opening of an outlet of said gas conduit and a conduit surface of said specimen is less than or equal to 1 mm.

23. The apparatus according to claim 22, wherein the inert gas forms a layer covering the area of incidence of said beam of charged particles.

24. The apparatus according to claim 23, wherein the layer of inert gas in the area of incidence of said beam of charged particles has a thickness of less than about the mean free path of the charged particles.

25. The apparatus according to claim 22, further comprising a nozzle, situated at the outlet of the gas conduit, said nozzle comprising an electrode.

26. The apparatus according to claim 22, further comprising an actuator adjusting the position of said nozzle.

27. The apparatus according to claim 22, further comprising at least one additional conduit arranged with said gas conduit in a symmetrical pattern around the area of incidence of said beam of charged particles onto the specimen.

28. The apparatus according to claim 25, further comprising a voltage controller applying a potential to said electrode.

29. The apparatus according to claim 25, wherein said electrode comprises a circular ring electrode.

30. The apparatus according to claim 25, wherein said electrode comprises a conductive net with at least one opening for said beam of charged particles.

31. The apparatus according to claim 22, further comprising:
a gas reservoir;
an evacuation chamber;
a gas flow valve connected to said reservoir, said evacuation chamber and said gas conduit; and
a controller controlling said valve to alternately couple said conduit to said gas reservoir and evacuation chamber.

32. An apparatus for examining a specimen with a beam of charged particles, said apparatus comprising:
a particle column providing a beam of charged particles;
an objective lens situated inside the column;
a vacuum chamber enclosing the specimen;
a gas conduit providing inert gas to an area of incidence of said beam of charged particles onto said specimen;
whereby an opening of said gas conduit has a working distance from an area of the specimen at which the beam is incident that is less than or equal to 0.5 mm.

33. The apparatus according to claim 32, wherein the inert gas forms a layer covering the area of incidence of said beam of charged particles.

34. The apparatus according to claim 33, wherein the layer of inert gas in the area of incidence of said beam of charged particles has a thickness of less than about the mean free path of the charged particles.

35. The apparatus according to claim 32, further comprising a nozzle, situated at the outlet of the gas conduit, said nozzle comprising an electrode.

36. The apparatus according to claim 32, further comprising an actuator adjusting the position of said nozzle.

37. The apparatus according to claim 32, further comprising at least one additional conduit arranged with said gas conduit in a symmetrical pattern around the area of incidence of said beam of charged particles onto the specimen.

38. The apparatus according to claim 35, further comprising a voltage controller applying a potential to said electrode.

39. The apparatus according to claim 35, wherein said electrode comprises a circular ring electrode.

40. The apparatus according to claim 35, wherein said electrode comprises a conductive net with at least one opening for said beam of charged particles.

41. The apparatus according to claim 32, further comprising:
- a gas reservoir;
- an evacuation chamber;
- a gas flow valve connected to said reservoir, said evacuation chamber and said gas conduit; and
- a controller controlling said valve to alternately couple said conduit to said gas reservoir and evacuation chamber.

42. An apparatus for examining a specimen with a beam of charged particles, said apparatus comprising:
- a particle column providing a beam of charged particles;
- an objective lens situated inside the column;
- a vacuum chamber enclosing the specimen;
- a gas conduit providing inert gas to an area of incidence of said beam of charged particles onto said specimen; and
- at least one nozzle connected to an outlet of the gas conduit so that the at least one nozzle is rotationally symmetrical with respect to the beam of charged particles in the area of incidence, the inert gas being provided to the area of incidence via the at least one nozzle.

43. The apparatus according to claim 42, wherein the inert gas forms a layer covering the area of incidence of said beam of charged particles.

44. The apparatus according to claim 43, wherein the layer of inert gas in the area of incidence of said beam of charged particles has a thickness of less than about the mean free path of the charged particles.

45. The apparatus according to claim 42, wherein the nozzle comprises an electrode.

46. The apparatus according to claim 42, further comprising an actuator adjusting the position of said nozzle.

47. The apparatus according to claim 45, further comprising a voltage controller applying a potential to said electrode.

48. The apparatus according to claim 45, wherein said electrode comprises a circular ring electrode.

49. The apparatus according to claim 45, wherein said electrode comprises a conductive net with at least one opening for said beam of charged particles.

50. The apparatus according to claim 42, further comprising:
- a gas reservoir;
- an evacuation chamber;
- a gas flow valve connected to said reservoir, said evacuation chamber and said gas conduit; and
- a controller controlling said valve to alternately couple said conduit to said gas reservoir and evacuation chamber.

51. An apparatus for examining a specimen with a beam of charged particles, said apparatus comprising:
- a particle column providing a beam of charged particles;
- an objective lens situated inside the column;
- a vacuum chamber enclosing the specimen; and
- a gas conduit providing inert gas through a passage provided in said lens.

52. The apparatus according to claim 51, wherein said lens comprises a magnetic lens.

53. The apparatus according to claim 51, wherein said lens comprises an electrostatic lens.

54. An apparatus for examining a specimen with a beam of charged particles, said apparatus comprising:
- a particle column providing a beam of charged particles;
- an objective lens situated inside the column;
- a vacuum chamber enclosing the specimen; an
- a gas conduit providing inert gas to an area of incidence of said beam of charged particles onto said specimen;
- wherein an opening of said gas conduit has a diameter of about 100 microns.

55. The apparatus according to claim 54, wherein the inert gas forms a layer covering the area of incidence of said beam of charged particles.

56. The apparatus according to claim 55, wherein the layer of inert gas in the area of incidence of said beam of charged particles has a thickness of less than about the mean free path of the charged particles.

57. The apparatus according to claim 54, further comprising a nozzle, situated at the outlet of the gas conduit; said nozzle comprising an electrode.

58. The apparatus according to claim 54, further comprising an actuator adjusting the position of said nozzle.

59. The apparatus according to claim 54, further comprising at least one additional conduit arranged with said gas conduit in a symmetrical a pattern around the area of incidence of said beam of charged particles onto the specimen.

60. The apparatus according to claim 57, further comprising a voltage controller applying a potential to said electrode.

61. The apparatus according to claim 57, wherein said electrode comprises a circular ring electrode.

62. The apparatus according to claim 57, wherein said electrode comprises a conductive net with at least one opening for said beam of charged particles.

63. The apparatus according to claim 54, further comprising:
- a gas reservoir;
- an evacuation chamber;
- a gas flow valve connected to said reservoir, said evacuation chamber and said gas conduit; and
- a controller controlling said valve to alternately couple said conduit to said gas reservoir and evacuation chamber.

* * * * *

UNITED STATES PATENT AND TRADEMARK OFFICE
CERTIFICATE OF CORRECTION

PATENT NO. : 6,555,815 B2
DATED : April 29, 2003
INVENTOR(S) : Dieter Winkler and Hans-Peter Feuerbaum It is certified that error appears in the above-identified patent and that said Letters Patent is hereby corrected as shown below:

Column 12,
Line 23, please delete "conduit" (second occurrence).

Signed and Sealed this

Third Day of August, 2004

JON W. DUDAS
*Acting Director of the United States Patent and Trademark Office*